(12) United States Patent
Barthel et al.

(10) Patent No.: US 11,378,592 B2
(45) Date of Patent: Jul. 5, 2022

(54) METHOD FOR ANALYZING A MEASURED SIGNAL AND OSCILLOSCOPE

(71) Applicant: Rohde & Schwarz GmbH & Co. KG, Munich (DE)

(72) Inventors: Sven Barthel, Chemnitz (DE); Michael Boehme, Starkenberg (DE); Thomas Guenther, Waldenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 771 days.

(21) Appl. No.: 15/699,855

(22) Filed: Sep. 8, 2017

(65) Prior Publication Data

US 2019/0079115 A1    Mar. 14, 2019

(51) Int. Cl.
*G01R 13/02* (2006.01)
*G01R 13/04* (2006.01)

(52) U.S. Cl.
CPC ..... *G01R 13/0272* (2013.01); *G01R 13/0254* (2013.01); *G01R 13/04* (2013.01)

(58) Field of Classification Search
CPC . G01R 13/0272; G01R 13/0254; G01R 13/04
See application file for complete search history.

(56) References Cited

U.S. PATENT DOCUMENTS

| 4,336,810 A * | 6/1982 | Anderson | A61B 5/04365 600/515 |
| 7,460,967 B2 | 12/2008 | Duff | |
| 2007/0282542 A1 * | 12/2007 | Duff | G01R 13/0254 702/35 |
| 2008/0001949 A1 * | 1/2008 | Duff | G06T 3/40 345/440.1 |

OTHER PUBLICATIONS

Tektronix, Oscilloscope Fundamentals, pp. 1-59 (Year: 2009).*

* cited by examiner

*Primary Examiner* — Lisa E Peters
(74) *Attorney, Agent, or Firm* — Christensen O'Connor Johnson Kindness PLLC

(57) ABSTRACT

A method for analyzing a measured signal is described wherein at least a first segment and a second segment of said measured signal are acquired by a measurement device. At least said first segment and said second segment are stored in an acquisition memory of said measurement device. A search criterion is applied on at least said first segment and said second segment. At least a first timing event corresponding to said search criterion is stored into a memory, said first timing event being found in at least one of said segments. Further, an oscilloscope is described.

16 Claims, 3 Drawing Sheets

METHOD FOR ANALYZING A MEASURED SIGNAL AND OSCILLOSCOPE

FIELD OF THE DISCLOSURE

Embodiments of the present disclosure relate generally to a method for analyzing a measured signal as well as an oscilloscope for analyzing a measured signal.

BACKGROUND

Oscilloscopes are commonly used for testing and visualizing signals by applying at least one trigger criterion or search criterion on the measured signal for deriving an event that fulfills the criterion applied. The trigger or search criterion may also be called trigger or search condition. The oscilloscope typically acquires a signal that is split in several segments for illustrative purposes. If the user searches for a seldom event in the acquired signal, in particular an event relating to multiple event types simultaneously, the user has to manually search the several segments for the respective seldom event resulting in a time-consuming manual analysis of the acquired signal.

Typically, a trigger criterion is used for scanning for one event type at the same time, particularly a hardware trigger, whereas a search criterion applied may scan for multiple event types simultaneously due to the fact that the search criterion corresponds to a software trigger applied on the signal acquired.

The search criterion is only applied on the segment that is currently visualized on a display of the oscilloscope. Thus, the user has to investigate all segments of the acquired signal manually in order to identify the seldom event.

Further, it is known that some oscilloscopes have a segment player that is configured to automatically play all segments acquired of the measured signal in a successive manner. Thus, the work for the user is simplified as an automatic image flow is provided by the segment player. However, once the user has identified the seldom event corresponding to the criterion applied, he has to stop the segment player and scroll back through the segments manually for obtaining the segment that comprises the event.

Thus, searching a seldom event in a measured signal is a complex and time consuming process.

Accordingly, there is a need for a possibility to analyze measured signals with regard to a certain search criterion in a simplified manner.

SUMMARY

Embodiments of the present disclosure provide a method for analyzing a measured signal. The method comprises the following steps:
  acquiring at least a first segment and a second segment of the measured signal by a measurement device,
  storing at least the first segment and the second segment in an acquisition memory of the measurement device,
  applying a search criterion on at least the first segment and the second segment, and
  storing at least a first timing event corresponding to the search criterion into a memory, the first timing event being found in at least one of the segments.

The measurement device used for analyzing the measured signal provides the possibility that an event can be detected automatically, and in some embodiment, where timing information of the event detected is also provided. In addition, the event detected can be assigned to a segment which is not currently displayed on the measurement device due to the fact that the event detected, fulfilling the search criterion applied, is stored in an appropriate memory. Thus, it is ensured that the event can be detected automatically without any manual input which improves the analysis of the measured signal appropriately. Accordingly, time-consuming manual analysis of the measured signal is no more required.

According to an aspect, the search criterion is applied to all segments. In case that the measured signal comprises more than two segments, the search criterion is applied on all segments of the measured signal in order to retrieve the event even though it is provided by a third or fourth segment. Hence, the search is done in all segments as the search criterion is applied to all segments.

Generally, the timing event corresponds to the search criterion that is applied on the segments of the measured signal which have been acquired previously. The timing event is an event with the respective time information of the occurrence of that event.

According to another aspect, applying the search criterion is introduced by hitting a button of the measurement device. For instance, the button may be provided by a display, in particular on a graphical user interface displayed. The button can be labeled as "ANALYZE ALL" or similar. Therefore, the user of the measurement device directly obtains the information that the search criterion is applied on all segments acquired when the respective button is hit.

Moreover, only one segment of the segments may be displayed at the same time. Thus, the search criterion can be applied on segments that are not currently displayed on the display of the measurement device.

The first timing event may be stored in the memory irrespective of the segment currently displayed. Therefore, information is retrieved about the signal acquired irrespective of the segment currently displayed on the display of the measurement device. For instance, the first segment is displayed whereas in the second segment a timing event is detected and stored appropriately.

Further, the segments may be repeatedly displayed on a display of the measurement device. Thus, the different segments obtained may be displayed on a main screen portion of the display in a successive manner. The order of the segments displayed may correspond to their acquisition time. Therefore, the user is enabled to revise all segments visually if desired.

In some embodiments, the repeatedly display is halted if the segment to be displayed comprises the first timing event. Thus, the user does not have to halt the displaying manually as it is stopped automatically. Accordingly, scrolling back to the segment having the timing event is not required which reduces the efforts for the analysis.

For instance, a segment player plays all segments in a successive manner, the playing being automatically hold if the segment to be displayed comprises the first timing event. This ensures that the segment having the timing event is displayed for at least a longer time than regularly in order to enable the user of the measurement device to verify the signal portion relating to the segment appropriately. Accordingly, the user does not have to scroll back through the segments displayed which improves the analysis appropriately.

The search criterion applied may be at least one of a pulse width, a certain signal level, a glitch search, and a runt pulse. These search criterions are typically applied on a signal acquired. Furthermore, these search criterions may provide seldom events being hard to find manually. Generally, the search criterion includes a digital trigger.

Moreover, several timing events are detected and stored in a table format. The table generated may be displayed for informing the user about the timing events detected. Thus, the user can easily check the number of timing events that fulfill the search criterion applied even though the timing events are assigned to segments that are not displayed at that time. Moreover, the different timing events may be labeled with an index for distinguishing purposes. The indexes may be assigned to a certain time, namely the time information of the event within the respective segment.

Moreover, the table may comprise information about the number of the segment such that the table comprises information about the segment having an event, such as, for example its number, the number of the event due to the index provided, a timing information of the event, in particular the time of the occurrence, as well as a criterion information of the search criterion applied, for instance the pulse width.

The table may be called (search) event table since the events are listed in a table format that fulfill the search criterion applied. The table may be displayed in another region of the display with regard to the segment currently displayed such that both information can be provided simultaneously.

According to another aspect, only the segments are displayed that comprise timing events. Thus, the user may use a certain operation mode of the measurement device according to which only those segments are displayed that have a respective timing event.

For instance, the search criterion is applied when the acquisition is stopped. Accordingly, the measured signal is acquired completely such that the search criterion can be applied on all segments acquired. This ensures that no timing event is skipped.

The search criterion may be applied automatically. Thus, the user selects a certain operation mode of the measurement device which automatically applies the search criterion. Particularly, the search criterion is automatically applied after the acquisition has finished.

In some embodiments, the measurement device is an oscilloscope. Oscilloscopes are typically used for analyzing measured signals, in particular with regard to search criteria that are applied on the measured signal.

Further, an oscilloscope for analyzing a measured signal is provided that comprises a signal input for receiving a signal to be measured, an acquisition unit with an acquisition memory, and a processor unit. The acquisition unit is configured to acquire at least a first segment and a second segment of the measured signal such that at least the first segment and the second segment are stored in the acquisition memory. The processor unit is configured to access the acquisition memory and to apply a search criterion on the data acquired. The processor unit being further configured to store at least a first timing event that corresponds to the search criterion applied into a memory of the oscilloscope. Thus, the data with regard to the timing event is stored such that it can be automatically obtained and processed by the oscilloscope in order to simplify the analysis of the measured signal.

According to an aspect, the oscilloscope comprises an analog to digital converter configured to convert an analog input signal into at least one digital measured value. Hence, the analog signals supplied to the oscilloscope are digitized appropriately in order to be processed by the oscilloscope. In some embodiments, the search criterion can be applied on the at least one digital measured value since the search criterion corresponds to a software trigger.

Another aspect provides that the processor unit comprises a processor memory, the first timing event being stored in the processor memory. The processor unit accesses the acquisition memory for obtaining the segment(s) on which the search criterion is applied. Once an event is detected, the respective information may be at least buffered in the processor memory. The processor memory, in particular the data stored appropriately, may be accessed at a later stage for generating a table that is displayed for informing the user of the oscilloscope.

According to another aspect, the oscilloscope comprises a display with a display memory, the first timing event being stored in the display memory. Therefore, the display memory may generate the event table to be displayed, which comprises the timing events, directly as a template for the table is provided that is filled. The data stored in the display memory is displayed by the display in the order of their inscription. Accordingly, the data stored in the display memory is directly displayed without any further processing.

Moreover, the display memory may access the processor memory that provides at least the data of the events detected. Moreover, information or rather data concerning the table and typical information provided may also be accessed for completing the table.

Moreover, the oscilloscope may comprise a segment player connected to the acquisition unit, the segment player being configured to access the acquisition memory and to play all segments acquired in a successive manner, the segment player being configured to automatically hold the playing if the segment to be displayed comprises the first timing event. Thus, the user does not have to scroll back through all the segments if the user has identified an event fulfilling the search criterion applied. As the playing of the several segments is held automatically, the user can easily verify the properties of the segment acquired that comprises the event.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
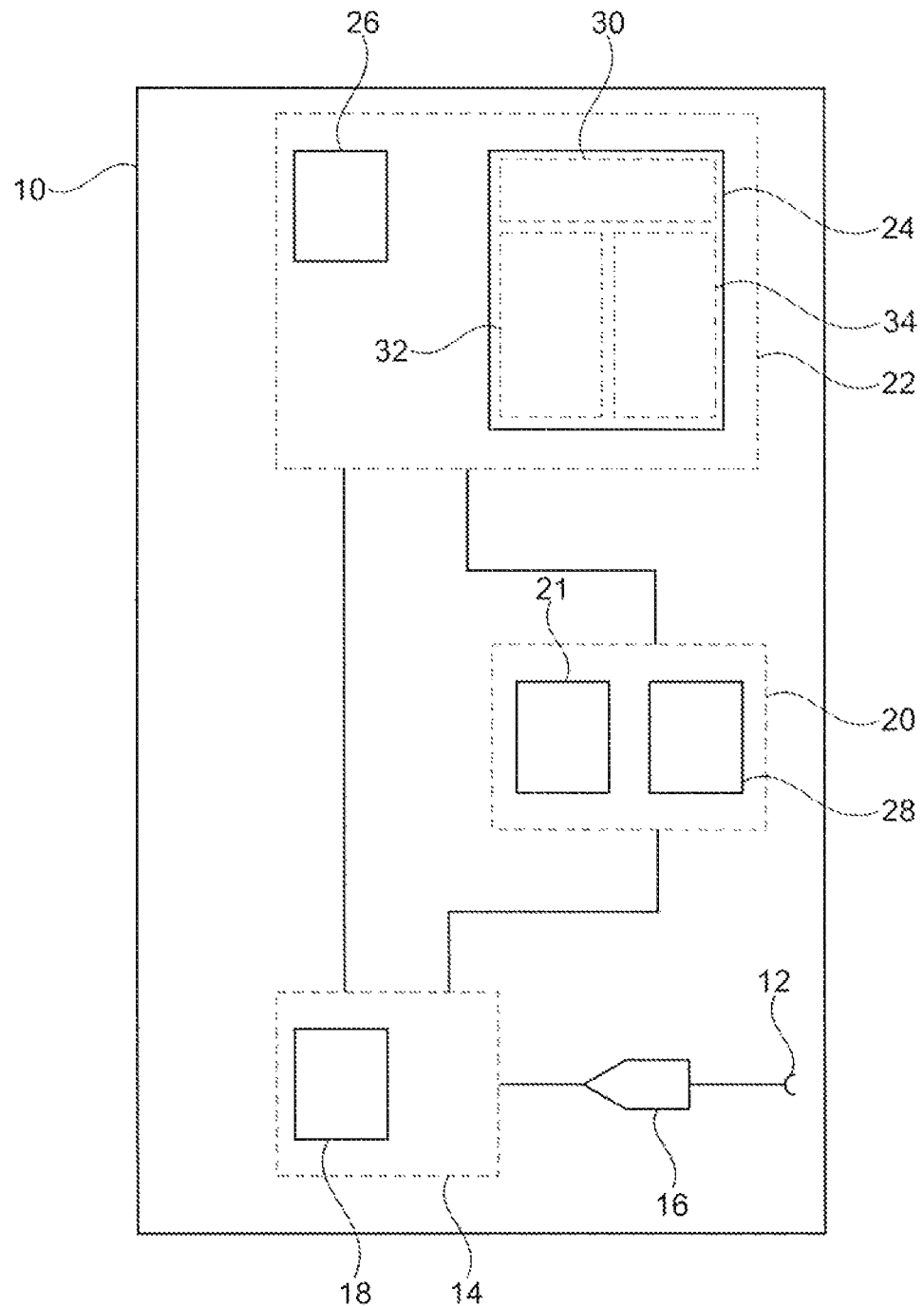
FIG. 1 shows a schematic overview of one representative embodiment of an oscilloscope according to the disclosure.

In FIG. 1, an oscilloscope 10 for analyzing a measured signal is shown. The oscilloscope 10 comprises at least one signal input 12 for receiving a measured signal, an acquisition unit 14 for acquiring at least a first segment and a second segment of said measured signal. An analog to digital converter 16 is interposed between the signal input 12 and the acquisition unit 14 such that an analog signal inputted is converted into at least one digital measured value that is forwarded to the acquisition unit 14.

The acquisition unit 14 comprises an acquisition memory 18 that is used for storing the several acquired segments of the measured signal appropriately. Typically, more than 100 different segments may be acquired, for instance 1,000 segments.

Further, a processor unit 20 is provided that is connected to the acquisition unit 14 in order to access the acquisition memory 18 for processing the segments stored or rather buffered in the acquisition memory 18. The processor unit 20 may be configured to apply a search criterion on the data acquired that is stored in the acquisition memory 18. The search criterion applied corresponds to a software trigger that is applied on the stored data. Accordingly, the search criterion is different to a typical hardware trigger. In some embodiments, the search criterion is one of a pulse width, a certain signal level, a glitch search, and a runt pulse. In some embodiments, the glitch search and the runt pulse are events that usually occur seldom.

The user of the oscilloscope 10 may further select one of several search criteria that can be applied.

While applying the search criterion on the data acquired and stored in the acquisition memory 18, the processor unit 20 is configured to store at least one timing event that corresponds to said search criterion. This means that the search conditions are fulfilled wherein appropriate data corresponding to the timing event is stored. Generally, the timing event stored, for example the respective data, comprises at least the time information of the occurrence of the event in the respective segment. This data can be stored in the acquisition memory 18 or in a processor memory 21 of the processor unit 20.

The oscilloscope 10 further comprises a display unit 22 that is connected to at least one of the acquisition unit 14 and the processor unit 20. The display unit 22 comprises a display 24 as well as a display memory 26. In the display memory 26, the data to be displayed is stored temporarily which means that the data stored in the display memory 26 will be displayed on the display 24 without any further processing. In an alternative embodiment, the processor unit 20 may store the data of the timing event directly into the display memory 26.

Figure 4:
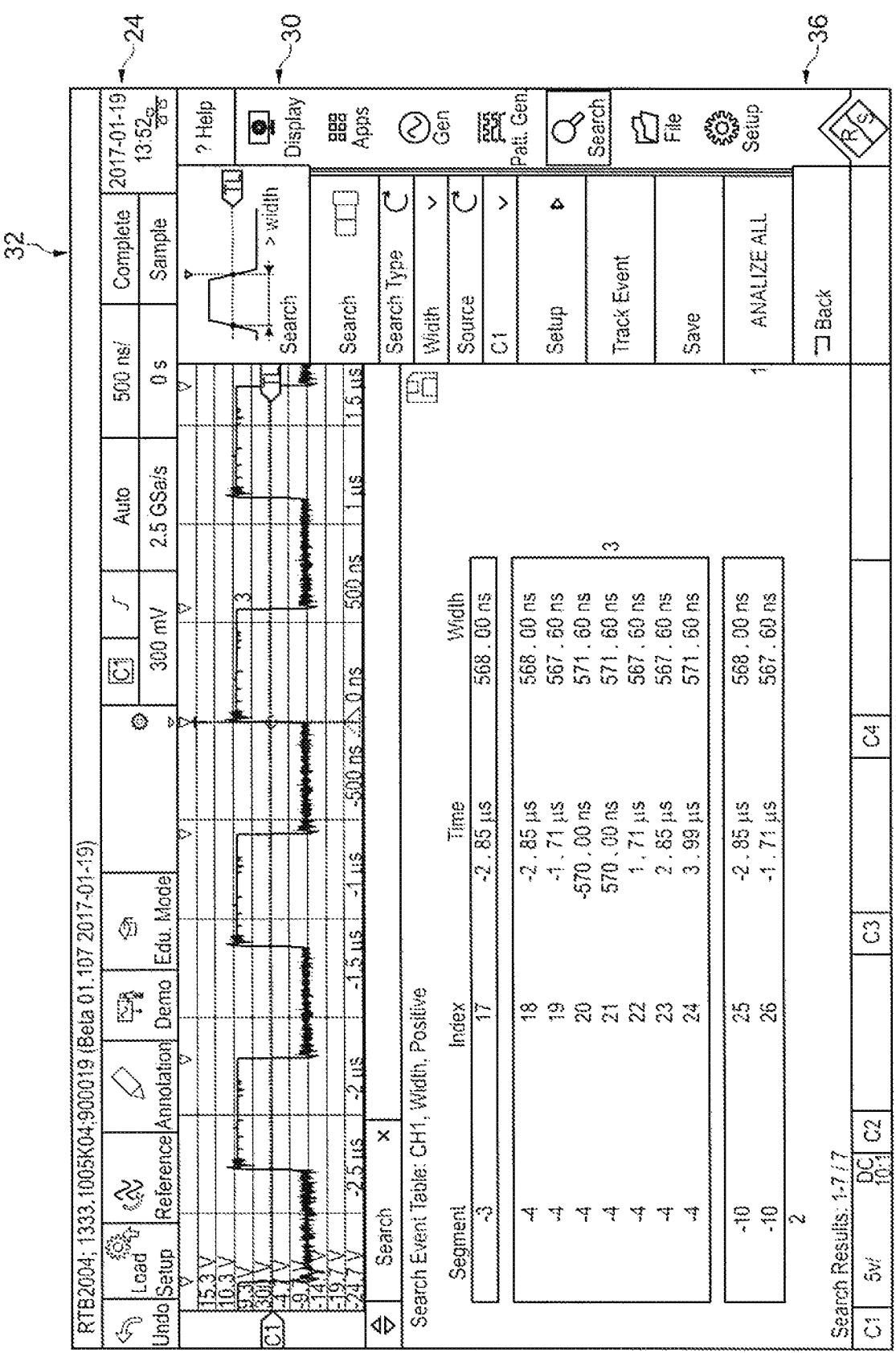
FIG. 4 shows a representative display of an oscilloscope according to the disclosure.

The display memory 26 is connected to the acquisition memory 18 such that the acquired segments stored in the acquisition memory 18 are forwarded to the display memory 26 for illustrative purposes as shown in FIG. 4. The data forwarded to the display memory 26 may be displayed on the display 24 in a successive manner.

For this purpose, the oscilloscope 10 comprises a segment player 28 that is connected to the acquisition unit 14. The segment player 28 and its concept become better understood while referring to FIG. 2. As shown in FIG. 1, the segment player 28 is part of the processor unit 20. Alternatively, the segment player 28 is formed separately with respect to the processor unit 20.

Figure 3:
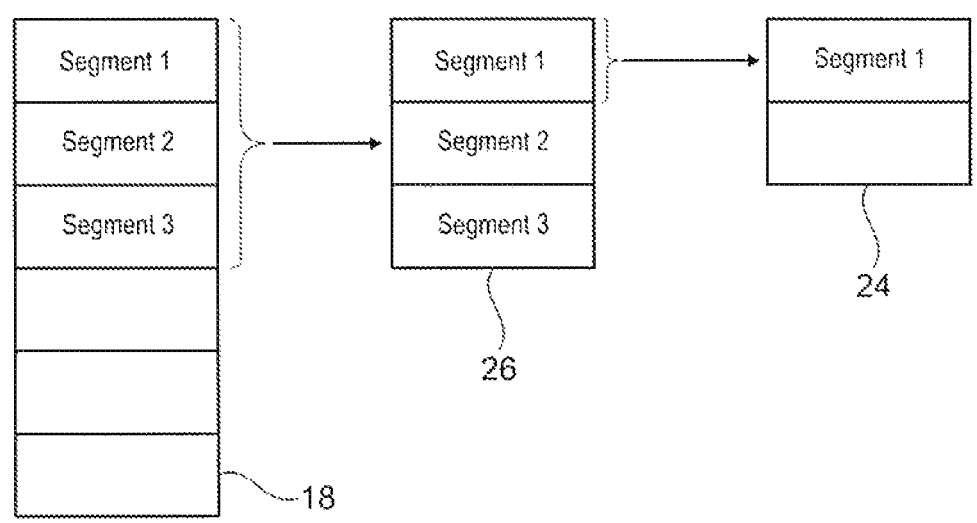
FIG. 3 shows another schematic overview illustrating the data flow within a representative embodiment of an oscilloscope according to the disclosure.

The segment player 28 is configured to display all segments acquired in a successive manner for a predefined time interval. The data stored in the display memory 26 is displayed by the display 24 in the order of their inscription as shown in FIG. 3. Accordingly, the data stored in the display memory 26 is directly displayed without any further processing. In a certain operation mode, only these segments are displayed that comprise a timing event in order to expedite the analysis of seldom events.

Figure 2:
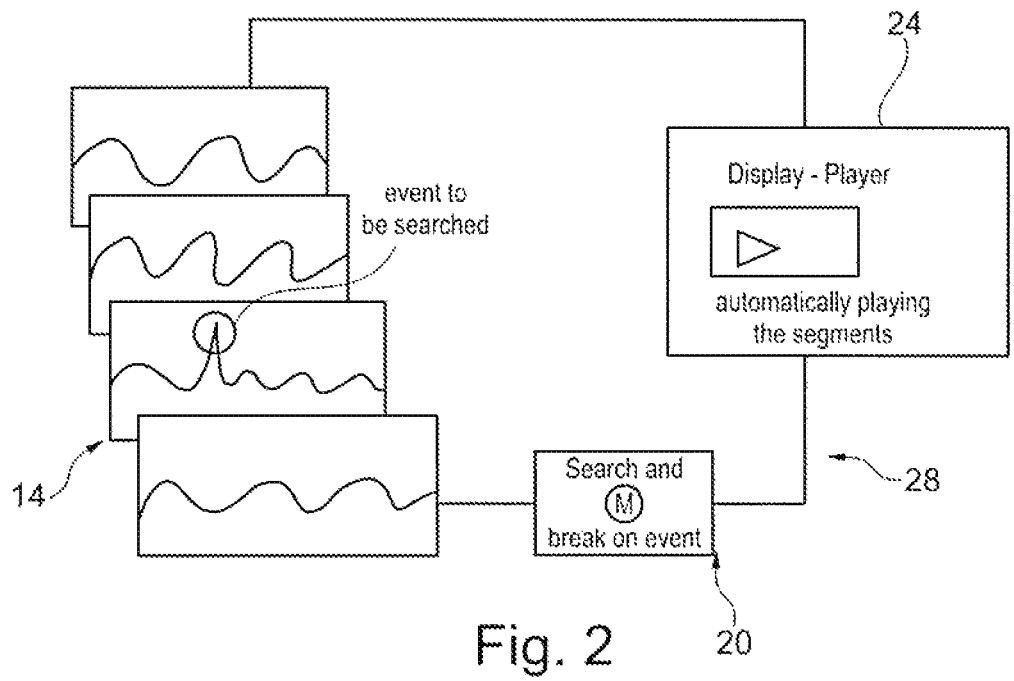
FIG. 2 shows a schematic overview of a segment player used by an embodiment according to the disclosure.

In general, the segments acquired are displayed repeatedly. As shown in FIG. 2, the segment player 28 automatically holds the playing if a segment displayed comprises a timing event corresponding to the search criterion applied on the segments.

The segment player 28 comprises a holding unit 29 for holding the playing as schematically shown in FIG. 2. In general, the user is enabled to check the segment displayed on the display 24 as it is held. Thus, the automatic repletion of the segments acquired is held by the holding unit 29, in particular wherein the holding unit 29 is part of the segment player 28.

As shown in FIG. 4, the processor unit 20 is configured to generate a table that comprises information regarding the timing events detected that correspond to the search criterion applied on all segments acquired. Therefore, the timing events gathered are stored in a table format. The table format may be generated by the processing unit 20 and forwarded to the display memory 26. Alternatively, the table format is predefined in the display memory 26 and the respective data is only filled in such that at least one of the acquisition unit 14 and the processing unit 20 only forwards the respective data to the display memory 26.

The display 24 displays a graphical user interface (GUI) with a drop-down menu for selecting a certain search type to be applied. Accordingly, the user may select the search criterion to be applied on the segments of the measured signal by selecting one of the items of the drop-down menu. In the shown embodiment, the pulse width is selected as the search criterion (search type) to be applied on the measured signal. Moreover, the user in some embodiments can select the source for the signal to be processed by the oscilloscope 10. In the shown embodiment, the source C1 has been selected. These settings can be done in a right portion 30 of the display 24.

In addition, the display 24 has a main display region 32 that is used for displaying one segment of the several segments acquired. However, only one segment of the several segments acquired is displayed simultaneously. In the shown embodiment, it is the fourth segment acquired that is shown in the main display region 32.

Besides the main display region 32, the display 24 displays a table that lists the timing events in a table region 34 of the display 24. In the table that may be called "event table", the timing events are listed for the segment currently displayed in the main display region 32 as well as further timing events, for instance the last timing event in one of the previous segments as well as upcoming timing events in subsequent segments.

Accordingly, timing events are stored for segments acquired that are not currently displayed. In some embodiments, timing events are already gathered for segments acquired prior to their displaying on the display 24. This can be done as the data has already been acquired. In fact, all segments are acquired by the acquisition unit 14 wherein the respective data is stored in the acquisition memory 18.

The shown segment, namely the fourth segment, comprises seven timing events that are labeled by the indexes 18 to 24 wherein only five timing events are shown in the main display region 32. Thus, the whole segment acquired must not be displayed in the main display region 32 completely, but at least a portion thereof.

Besides the events of the segment currently displayed, the event table lists the last timing event of the previous segments. In the shown embodiment, the event labeled by index 17 being part of the third segment is listed in the event table. Furthermore, upcoming events of the subsequent segments are also listed, namely the events labeled by the indexes 25 and 26. These events correspond to the tenth segment acquired. Therefore, the user already obtains the information that the upcoming segments 5 to 9 to be displayed do not comprise any event fulfilling the conditions of the search criterion applied.

The event table provides the information with regard to the time of the occurrence of the respective event within the segment as well as criterion information relating to the search criterion applied. In the shown embodiment, the width of the appropriate pulse is displayed.

In a certain operation mode of the oscilloscope 10, only the segments comprising timing events may be displayed in a successive manner such that the user does not have to scroll through all segments even though only one or two of the several segments acquired comprises timing events that correspond to the search criterion applied. Thus, the analysis of the measured signal is simplified and improved with regard to the time required.

In general, the search can be started automatically, for instance after finishing the acquisition of the measured signal. Thus, the search criterion is applied on all segments acquired directly after they have been acquired and their respective data is stored in the acquisition memory 18. Alternatively, the search may start automatically once a predefined number of data has been acquired even though the acquisition has not been finished completely.

Moreover, the graphical user interface shown in FIG. 4 comprises a button 36 labeled with "ANALYZE ALL" that can be hit by the user of the oscilloscope 10 to start the search. Prior to hitting the button 36, the user may select the search criterion to be applied while defining the search. Accordingly, a "one button click" solution is provided by the oscilloscope 10 which simplifies the search and analyses appropriately as only the relevant information is displayed. Therefore, the manual input is reduced which saves time.

As mentioned above, the timing events are gathered for all segments acquired as the search criterion selected is applied on all segments acquired irrespective of the segment currently displayed. As the data of all segments has already been acquired and stored appropriately, the search can be performed on all segments acquired in an automatic manner.

The processor unit 20 described above may include, in some embodiments, logic to perform, implement or otherwise carry out methodologies and technologies described above. In some embodiments, this logic of the processor unit 20 can be carried out in either hardware or software, or a combination of hardware and software. In some embodiments, the processor unit 20 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the processor unit 20 includes a microprocessor and a memory storing logic modules and/or instructions. In an embodiment, the processor unit 20 includes one or more ASICs having a plurality of predefined logic components. In an embodiment, the processor unit 20 includes one or more FPGA having a plurality of programmable logic components. In an embodiment, the processor unit 20 includes hardware circuit implementations (e.g., implementations in analog circuitry, implementations in digital circuitry, and the like, and combinations thereof). In an embodiment, the processor unit 20 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for analyzing a measured signal, the method comprising the following steps:
    a) acquiring at least a first segment of said measured signal and a second segment of said measured signal by an oscilloscope,
    b) storing at least said first segment and said second segment in an acquisition memory of said oscilloscope,
    c) applying a search criterion on at least said first segment and said second segment by a processor unit of said oscilloscope, and
    d) storing at least a first timing event corresponding to said search criterion into a memory, said first timing event being found in at least one of said segments;
    wherein a segment player plays all segments in a successive manner, said playing being automatically halted if said segment to be displayed comprises said first timing event, and
    wherein said search criterion is associated with at least one of a pulse width, a certain signal level, a glitch search, a runt pulse, or a search criterion selected by a user.

2. The method according to claim 1, wherein said search criterion is applied to all segments.

3. The method according to claim 1, wherein applying said search criterion is introduced by hitting a button of said oscilloscope.

4. The method according to claim 1, wherein only one segment of said segments is displayed at a time.

5. The method according to claim 4, wherein said first timing event is stored in said memory irrespective of the segment currently displayed.

6. The method according to claim 1, wherein said segments are repeatedly displayed on a display of said oscilloscope.

7. The method according to claim 6, wherein said repeatedly displaying is halted if said segment to be displayed comprises said first timing event.

8. The method according to claim 1, wherein several timing events are detected and stored in a table format.

9. The method according to claim 1, wherein only said segments are displayed that comprise a timing event.

10. The method according to claim 1, wherein said search criterion is applied when said acquisition is stopped.

11. The method according to claim 1, wherein said search criterion is applied automatically.

12. An oscilloscope for analyzing a measured signal, said oscilloscope comprising:
- a signal input for receiving a signal to be measured;
- an acquisition circuit with an acquisition memory, said acquisition circuit being configured to acquire at least a first segment of said measured signal and a second segment of said measured signal such that at least said first segment and said second segment are stored in said acquisition memory;
- a processor unit configured to access said acquisition memory and to apply a search criterion on said data acquired, said processor unit being further configured to store at least a first timing event corresponding to said search criterion applied into a memory of said oscilloscope, and
- a segment player connected to said acquisition circuit, said segment player being configured to access said acquisition memory and to play all segments acquired in a successive manner, said segment player being configured to automatically halt said playing if said segment to be displayed comprises said first timing event,
- wherein said search criterion is associated with at least one of a pulse width, a certain signal level, a glitch search, a runt pulse, or a search criterion selected by a user.

13. The oscilloscope according to claim 12, wherein said oscilloscope comprises an analog to digital converter configured to convert an analog input signal into at least one digital measured value.

14. The oscilloscope according to claim 12, wherein said processor unit comprises a processor memory, said first timing event being stored in said processor memory.

15. The oscilloscope according to claim 12, wherein said oscilloscope comprises a display with a display memory, said first timing event being stored in said display memory.

16. A method for analyzing a measured signal, the method comprising:
- acquiring at least a first segment of said measured signal and a second segment of said measured signal by an oscilloscope;
- storing at least said first segment and said second segment in an acquisition memory of said oscilloscope;
- applying a search criterion on at least said first segment and said second segment by a processor unit of said oscilloscope; and
- storing at least a first timing event corresponding to said search criterion into a memory of the oscilloscope, said first timing event being found in at least one of said segments,
- wherein only one segment of said segments is displayed at a time such that the search criterion is applied on at least one segment that is not currently displayed on a display of the oscilloscope,
- wherein said first timing event is stored in said memory irrespective of the segment currently displayed,
- wherein a segment player plays all segments in a successive manner, said playing being automatically halted if said segment to be displayed comprises said first timing event, and
- wherein said search criterion is associated with at least one of a pulse width or a glitch search.

* * * * *